(12) United States Patent
Sun et al.

(10) Patent No.: US 9,904,839 B2
(45) Date of Patent: Feb. 27, 2018

(54) FINGERPRINT DETECTION APPARATUS, MOBILE DEVICE USING THE SAME AND MANUFACTURING METHOD THEREOF

(71) Applicant: Eosmem Corporation, Zhubei, Hsinchu County (TW)

(72) Inventors: Ching-Cherng Sun, Taoyuan (TW); Jia-Lung Wang, Zhubei (TW); Jhih-You Cai, Taoyuan (TW); Yu-Yu Chang, Kaohsiung (TW); Hui-Min Tsai, Zhubei (TW); Ching-Lung Ti, Zhubei (TW); Yeh-Wei Yu, Taoyuan (TW)

(73) Assignee: EOSMEM CORPORATION, Zhubei, Hsinchu County (TW)

( * ) Notice: Subject to any disclaimer, the term of this patent is extended or adjusted under 35 U.S.C. 154(b) by 124 days.

(21) Appl. No.: 15/144,149

(22) Filed: May 2, 2016

(65) Prior Publication Data

US 2016/0328595 A1 Nov. 10, 2016

Related U.S. Application Data

(60) Provisional application No. 62/156,758, filed on May 4, 2015.

(51) Int. Cl.
*G06K 9/00* (2006.01)
*H01L 31/167* (2006.01)
*H01L 31/0216* (2014.01)
*H01L 27/146* (2006.01)
*H04M 1/02* (2006.01)

(52) U.S. Cl.
CPC ....... *G06K 9/0004* (2013.01); *G06K 9/00053* (2013.01); *H01L 27/1469* (2013.01); *H01L 27/14623* (2013.01); *H01L 27/14629* (2013.01); *H01L 27/14634* (2013.01); *H01L 27/14678* (2013.01); *H01L 27/14685* (2013.01); *H01L 27/14698* (2013.01); *H01L 31/02164* (2013.01); *H01L 31/167* (2013.01); *H04M 1/026* (2013.01)

(58) Field of Classification Search
CPC .............. G06K 9/0004; G06K 9/00053; H01L 27/14623; H01L 27/14629; H01L 27/14634; H01L 27/14678; H01L 27/14685; H01L 27/1469; H01L 27/14698; H01L 31/02164; H01L 31/167; H04M 1/026
USPC .......................................... 382/124
See application file for complete search history.

(56) References Cited

U.S. PATENT DOCUMENTS

| | | | |
|---|---|---|---|
| 5,726,443 A | 3/1998 | Immega et al. | |
| 6,829,375 B1 * | 12/2004 | Higuchi | G06K 9/0004 382/124 |
| 7,177,451 B2 | 2/2007 | Higuchi | |
| 7,366,331 B2 | 4/2008 | Higuchi | |

(Continued)

*Primary Examiner* — Manuchehr Rahmjoo
(74) *Attorney, Agent, or Firm* — Muncy, Geissler, Olds & Lowe, P.C.

(57) ABSTRACT

A fingerprint detection apparatus, a mobile device using the same and a manufacturing method thereof are provided. The fingerprint detection apparatus comprises an image sensing integrated circuit and a spatial filter disposed on the image sensing integrated circuit. The spatial filter has adjacent light tunnels for restricting an incident angle of light to the image sensing integrated circuit to prevent scattered light from entering the image sensing integrated circuit.

11 Claims, 19 Drawing Sheets

(56) References Cited

U.S. PATENT DOCUMENTS

2016/0224816 A1  8/2016  Smith et al.
2016/0247010 A1  8/2016  Huang et al.
2016/0254312 A1  9/2016  Lee et al.

* cited by examiner

FINGERPRINT DETECTION APPARATUS, MOBILE DEVICE USING THE SAME AND MANUFACTURING METHOD THEREOF

This application claims priority to U.S. Provisional Patent Application Ser. No. 62/156,758 filed on May 4, 2015 which is incorporated herein by reference in its entirety.

BACKGROUND OF THE INVENTION

Field of the Invention

The invention relates to the fingerprint identification technology, and more particularly to a fingerprint detection apparatus disposed under a protective glass, and a manufacturing method thereof, wherein the fingerprint detection apparatus is disposed under a protective glass by a distance and still can capture a fingerprint pattern.

Description of the Related Art

FIG. 1 shows a structure of a fingerprint input device disclosed in U.S. Pat. No. 6,829,375. Referring to FIG. 1, the conventional fingerprint input device comprises a two-dimensional image sensor 101, a light source 102 and a thinned protective glass 103. The user's finger directly contacts the thinned protective glass 103. The light source 102 emits the light with the designated frequency to the finger, and the finger reflects the scattered light. The two-dimensional image sensor 101 receives the scattered light directly from the finger's ridge portion, and the scattered light scattered by the finger's valley portion diffuses.

In the prior art, the protective glass is very thin, and the image sensor detects the ridge portion as the bright portion and detects the finger's valley portion as the dark portion.

However, when the protective glass is too thick or an air gap is formed between the image sensor and the protective glass, the image sensor cannot capture the fingerprint.

SUMMARY OF THE INVENTION

An object of the invention is to provide a fingerprint detection apparatus disposed under a protective glass, a mobile device using the same and a manufacturing method thereof. The fingerprint detection apparatus may be disposed under a protective glass by a distance (an air gap). Alternatively, when the protective glass is too thick, the operation of capturing the pattern of the fingerprint still can be performed.

In view of this, the invention provides a fingerprint detection apparatus, which comprises an image sensing integrated circuit and a spatial filter. The spatial filter is disposed on the image sensing integrated circuit. The spatial filter has adjacent light tunnels. The light tunnel restricts an incident angle of light to the image sensing integrated circuit to prevent scattered light from entering the image sensing integrated circuit.

The invention additionally provides a mobile device comprising a display panel, a control circuit, a protective glass and a fingerprint detection apparatus. The protective glass is disposed on the display panel. The fingerprint detection apparatus comprises an image sensing integrated circuit and a spatial filter. The image sensing integrated circuit is electrically connected to the control circuit. The spatial filter is disposed on the image sensing integrated circuit. The spatial filter has adjacent light tunnels. The light tunnel restricts an incident angle of light to the image sensing integrated circuit to prevent scattered light from entering the image sensing integrated circuit.

In the fingerprint detection apparatus and the mobile device according to the preferred embodiment of the invention, the light tunnels of the spatial filter constitute a two-dimensional array. In addition, in a preferred embodiment, the fingerprint detection apparatus further comprises a specific light emitting circuit, wherein the specific light emitting circuit is disposed on one side of the image sensing integrated circuit and is electrically connected to the image sensing integrated circuit. Furthermore, in a preferred embodiment, the fingerprint detection apparatus and the mobile device further comprise a visible light emitting circuit, wherein the visible light emitting circuit is disposed on one side of the image sensing integrated circuit, and is electrically connected to the image sensing integrated circuit, wherein when a fingerprint identification is performed, the visible light emitting circuit emits a visible light to make a user obtain a finger placement position according to the visible light.

The invention additionally provides a method of manufacturing a fingerprint detection apparatus. The method comprises the steps of: forming multiple image sensing integrated circuits on a wafer; coating a photoresist layer on the image sensing integrated circuits; performing an photolithography process on the image sensing integrated circuits to form multiple photoresist pillar structures; performing a baking process on the photoresist pillar structures; dicing the wafer to obtain multiple diced image sensing integrated circuits; disposing at least one of the diced image sensing integrated circuits onto a substrate; performing a molding process on the photoresist pillar structure of the diced image sensing integrated circuit; performing a grinding process to expose the photoresist pillar structure; and performing a trimming process to trim a semi-facture of the fingerprint detection apparatus into factures.

In the method of manufacturing the fingerprint detection apparatus according to the preferred embodiment of the invention, the step of performing the photolithography process to form the photoresist pillar structures on the image sensing integrated circuit comprises the sub-steps of: providing a grating mask; and performing exposure on the photoresist layer through the grating mask.

In the method of manufacturing the fingerprint detection apparatus according to the preferred embodiment of the invention, the step of disposing the at least one of the diced image sensing integrated circuits onto the substrate comprises the sub-steps of: providing a printed circuit board substrate; fixing the diced image sensing integrated circuit to the printed circuit board substrate; and performing a wire bonding process.

The method of manufacturing the fingerprint detection apparatus according to the preferred embodiment of the invention further comprises, before the step of performing the grinding process to expose the photoresist pillar structure, the step of performing a surface treatment. In addition, the surface treatment comprises performing a specific-light filtering object configuration, to dispose a special-light filtering object on the photoresist pillar structure.

The invention additionally provides a method of manufacturing a fingerprint detection apparatus. The method comprises the steps of: forming multiple image sensing integrated circuits on a wafer; dicing the wafer to obtain multiple diced image sensing integrated circuits; disposing at least one of the diced image sensing integrated circuits onto a substrate; performing a molding process to package the diced image sensing integrated circuit into a specific package material; performing a laser drilling process to constitute a spatial filter on the diced image sensing integrated circuit, wherein the spatial filter has adjacent light tunnels, and the light tunnel restricts an incident angle of light to the image sensing integrated circuit to prevent scattered light from entering an image sensing circuit; and performing a trimming process to trim a semi-facture of the fingerprint detection apparatus into factures.

The invention additionally provides a method of manufacturing a fingerprint detection apparatus. The method comprises the steps of: forming multiple image sensing integrated circuits on a wafer; coating a photoresist layer on the image sensing integrated circuits; performing an photolithography process to form adjacent light tunnels on the image sensing integrated circuits, wherein the light tunnel restricts an incident angle of light to the image sensing integrated circuit to prevent scattered light from entering the image sensing integrated circuit; performing a baking process; dicing the wafer to obtain multiple diced image sensing integrated circuits; disposing at least one of the diced image sensing integrated circuits onto a substrate; performing a molding process on the photoresist pillar structure of the diced image sensing integrated circuit; and performing a trimming process to trim a semi-facture of the fingerprint detection apparatus into factures.

The essence of the invention is to form a spatial filter, which restricts the scattered light from entering the image sensing integrated circuit and is disposed above the image sensing integrated circuit, by various processing methods. Thus, even if the fingerprint detection apparatus is disposed on the too-thick protective glass, the fingerprint detection apparatus is disposed under a protective glass by a distance, or an air gap is present between the fingerprint detection apparatus and the protective glass, the image sensing integrated circuit still can normally perform the operation of capturing the pattern of the fingerprint without being affected by the scattered light.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

DETAILED DESCRIPTION OF THE INVENTION

Figure 1:
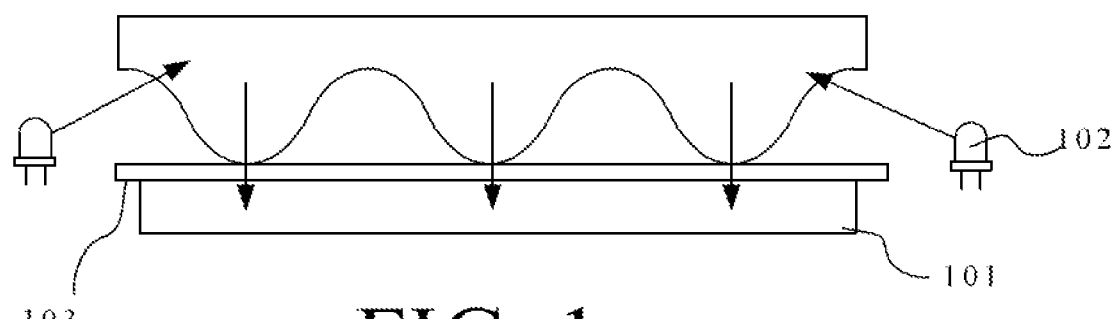
FIG. 1 shows a structure of a fingerprint input device disclosed in U.S. Pat. No. 6,829,375.

Because the current mobile devices are widely used, the mobile device typically has a protective glass. However, the conventional fingerprint identification apparatus is free from the identification error only when the glass is very thin. If the glass is too thick, the scattered light enters and affects the sensing integrated circuit, so that the fingerprint's ridge portion and valley portion cannot be distinguished from each other. In addition, if the fingerprint identification apparatus is to be disposed under the protective glass, an air gap is unavoidably present in the bonding process to cause the scattered light. The following preferred embodiments solve the above-mentioned problems according to the essence and method of the invention.

In the embodiments and claims, spatially relative terms, such as "underlying," "below," "lower," "overlying," "upper" and the like, may be used herein for ease of description to describe one element or feature's relationship to another element(s) or feature(s) as illustrated in the figures. Those skilled in the art may understand that the spatially relative terms are intended to encompass different orientations of the apparatus in use or operation in addition to the orientation depicted in the figures. For example, if an apparatus in the drawing is turned over, elements or features described as "below" or "beneath" other elements or features would then be oriented "above" the other elements. The terms "below" or "beneath" can, therefore, encompass both an orientation of above and below. If the apparatus may be otherwise oriented (rotated 90 degrees or at other orientations), then the spatially relative descriptors used herein may likewise be interpreted accordingly.

Figure 2:
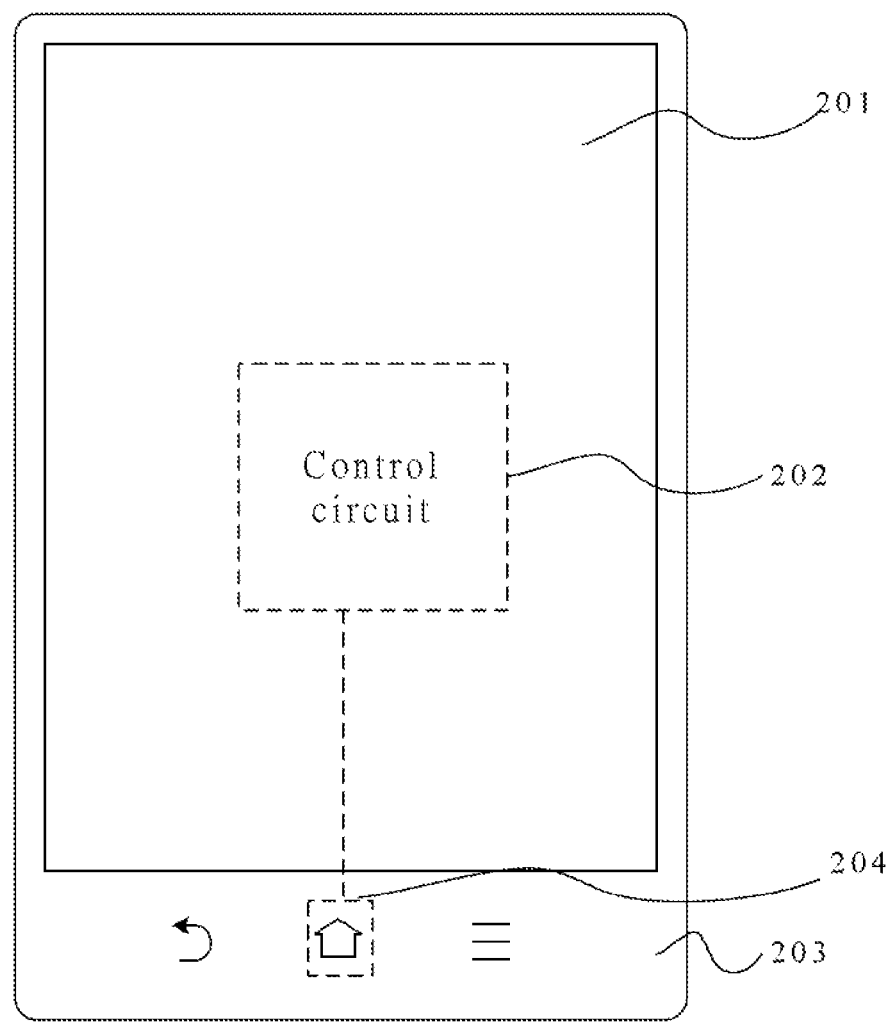
FIG. 2 is a schematic view showing a mobile device according to a preferred embodiment of the invention.

FIG. 2 is a schematic view showing a mobile device according to a preferred embodiment of the invention. Referring to FIG. 2, the mobile device of this embodiment comprises a display panel 201, a control circuit 202, a cover layer 203 and a fingerprint detection apparatus 204. In this embodiment, the cover layer 203 is disposed above the display panel and covers the entire mobile device. The fingerprint detection apparatus 204 is disposed under the cover layer 203. Generally speaking, in the example of the current smart mobile phone, the cover layer 203 is implemented by a protective glass. The control circuit 202 electrically connected to the display panel 201 and the fingerprint detection apparatus 204 controls the display panel 201 and the fingerprint detection apparatus 204. In this embodiment, the fingerprint detection apparatus 204 is disposed under the cover layer 203, that is, under the protective glass. In addition, the fingerprint detection apparatus 204 is disposed under a virtual touch button (HOME). In the prior art, the fingerprint detection apparatus 204 is disposed in a physical button based on two reasons.

Regarding the first reason, if an optical device, such as a prism, a light guide or the like is disposed inside the fingerprint detection apparatus, then the volume thereof is too huge and the manufacturing processes are complicated, so that it is difficult to implement the thinned combination with the protective glass.

Regarding the second reason, if the fingerprint detection apparatus is not implemented in an optical manner, the processed material thereof is completely different from the protective glass. So, the independent physical button is frequently implemented.

In the embodiment of the invention, the fingerprint detection apparatus 204 does not employ the optical device, and overcomes the scattered light to capture the correct fingerprint image without considering the condition of the thickness of the glass.

Figure 3:
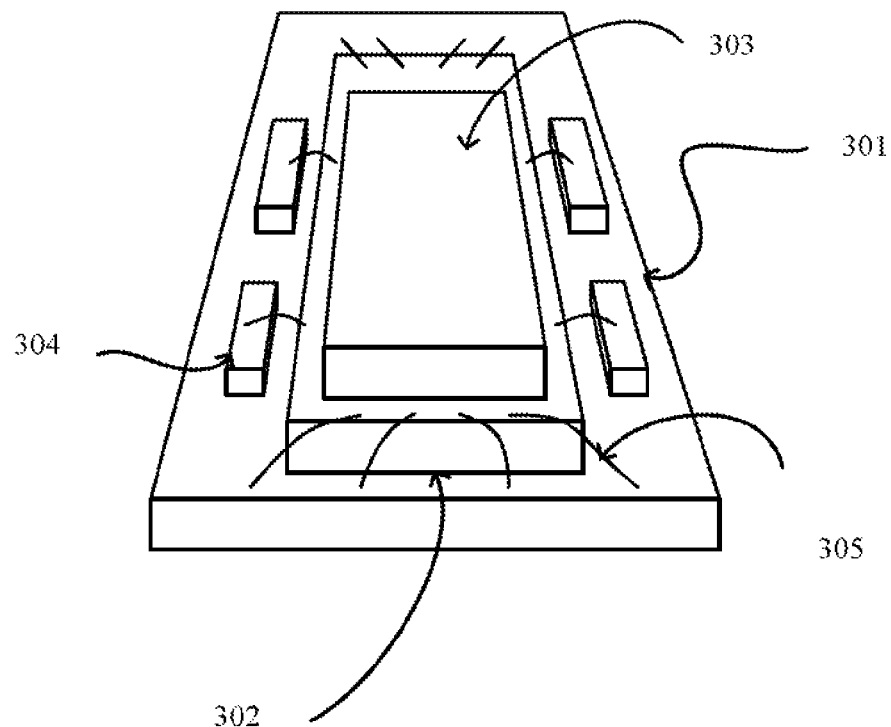
FIG. 3 shows the structure of the fingerprint detection apparatus that can be disposed under a cover layer 203 according to a preferred embodiment of the invention.

FIG. 3 shows the structure of the fingerprint detection apparatus that can be disposed under the cover layer 203 according to a preferred embodiment of the invention. Referring to FIG. 3, the fingerprint detection apparatus comprises a substrate 301, an image sensing integrated circuit 302, a spatial filter 303, multiple light-emitting diodes (LEDs) 304 and multiple bonding wires 305. The image sensing integrated circuit 302 captures the finger's fingerprint. The spatial filter 303 is disposed on the image sensing integrated circuit 302. The spatial filter 303 of this embodiment mainly functions to guide the linear light into the image sensing integrated circuit 302, and block, restrict or absorb the scattered light from entering the image sensing integrated circuit 302.

The fingerprint detection apparatus may includes a specific light emitting circuit, such as one, two, three or four of the light emitting diodes 304, for emitting a specific wavelength light to the finger to let the finger emit the scattering light. The specific light emitting circuit can be disposed on one side of the image sensing integrated circuit 302, and is electrically connected to the image sensing integrated circuit 302. The specific light emitting circuit can be implemented by a infrared LED or other single wavelength light source. Thus, the present invention is not limited thereto. The fingerprint detection apparatus may also includes a visible light emitting circuit, such as one, two, three or four of the light emitting diodes 304. The visible light emitting circuit is disposed on one side of the image sensing integrated circuit 302, and is electrically connected to the image sensing integrated circuit 302. When a fingerprint identification is performed, the visible light emitting circuit emits a visible light to make a user obtain a finger placement position according to the visible light. The image sensing integrated circuit 302 may be controlled by the control circuit 202 to control the visible light emitting circuit to emit the visible light.

Figure 4:
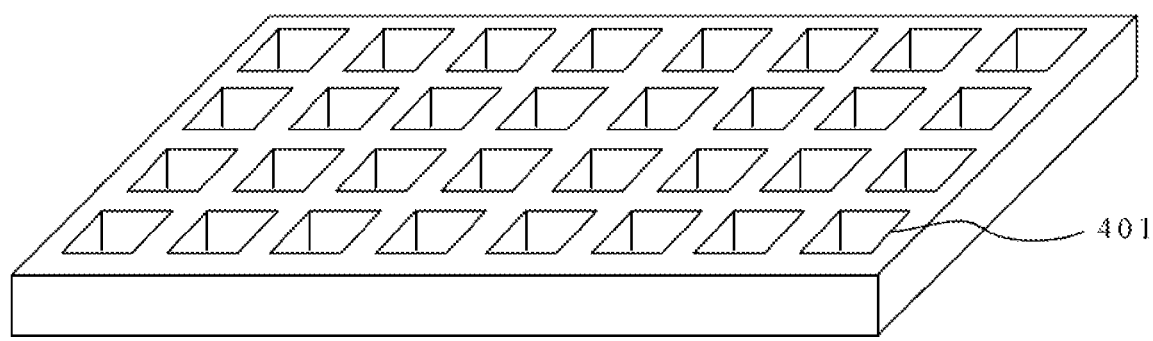
FIG. 4 shows the structure of a spatial filter 303 of the fingerprint detection apparatus that may be disposed under the cover layer 203 according to a preferred embodiment of the invention.

FIG. 4 shows the structure of the spatial filter 303 of the fingerprint detection apparatus that may be disposed under the cover layer 203 according to a preferred embodiment of the invention. Referring to FIG. 4, the spatial filter 303 of this embodiment has multiple light tunnels 401, which function to make the linear light enter the image sensing integrated circuit 302, and to block, restrict or absorb the scattered light from entering the image sensing integrated circuit 302. The light tunnels 401 of the spatial filter 303 has the light absorbing effects to prevent the scattered light from entering the photosensitive member of the image sensing integrated circuit 302. So, this spatial filter 303 has the effects of preventing the crosstalk and interference.

Figure 5:
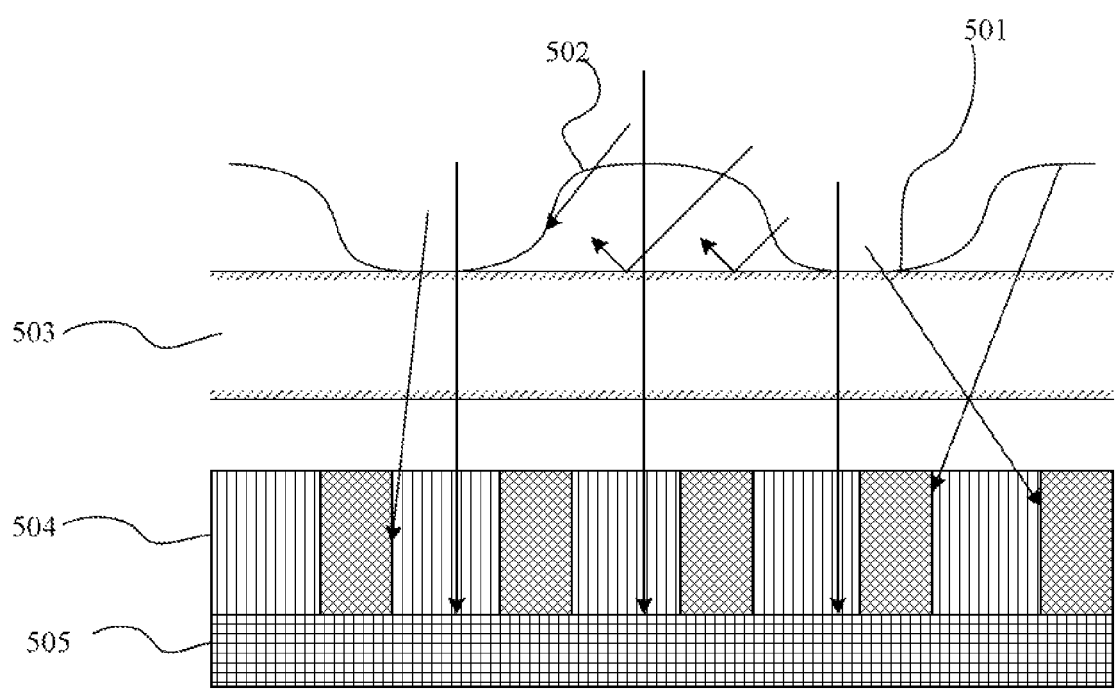
FIG. 5 is a schematic view showing the operation of the fingerprint detection apparatus that may be disposed under the cover layer 203 according to a preferred embodiment of the invention.

FIG. 5 is a schematic view showing the operation of the fingerprint detection apparatus that may be disposed under the cover layer 203 according to a preferred embodiment of the invention. Referring to FIG. 5, symbol 501 represents the ridge portion of the finger's fingerprint; symbol 502 represents the valley portion of the finger's fingerprint; symbol 503 represents the protective glass; symbol 504 represents the spatial filter; and symbol 505 represents the image sensing integrated circuit. In this schematic view, it is obtained that the linear light passes through the spatial filter 504 and enters the image sensing integrated circuit 505. The scattered light caused by the valley portion of the finger's fingerprint is reflected by the protective glass and blocked or absorbed by the non-light-tunnel portion of the spatial filter 504. The scattered light caused by the ridge portion of the finger's fingerprint is blocked or absorbed by the non-light-tunnel portion of the spatial filter 504. Thus, the image sensing integrated circuit 505 only receives the light substantially linearly incident to the image sensing integrated circuit 505, and cannot receive the scattered light, so that the image quality of the fingerprint can be enhanced.

In the embodiment, the cover layer that is not in contact with the fingerprint detection apparatus is illustrated as an example. However, those skilled in the art should know that the invention is not limited to the condition where a gap is present between the cover layer and the fingerprint detection apparatus. The invention may also be applied to the condition where no gap is present between the fingerprint detection apparatus and the cover layer. So, the invention is not restricted thereto.

Figure 6:
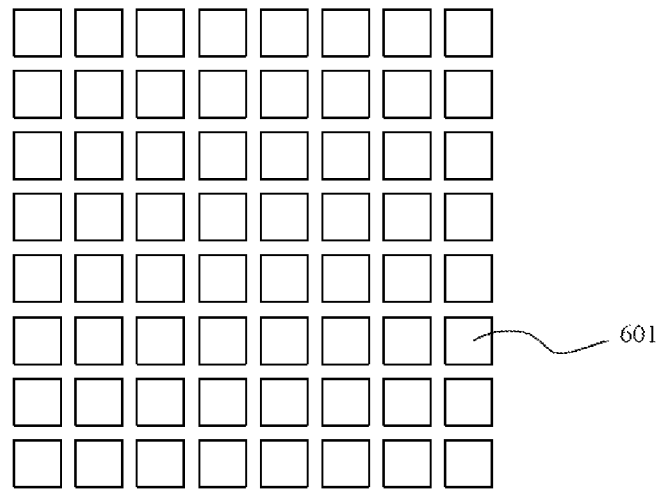
FIG. 6 is a top view showing the spatial filter 303 of the fingerprint detection apparatus that may be disposed under the cover layer 203 according to a preferred embodiment of the invention.
Figure 7:
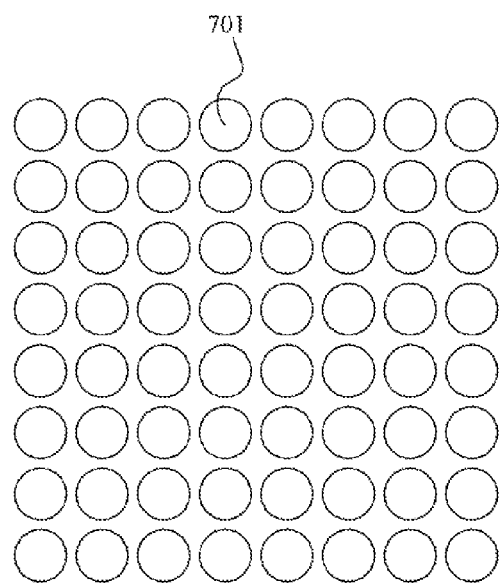
FIG. 7 is a top view showing the spatial filter 303 of the fingerprint detection apparatus that may be disposed under the cover layer 203 according to a preferred embodiment of the invention.
Figure 8:
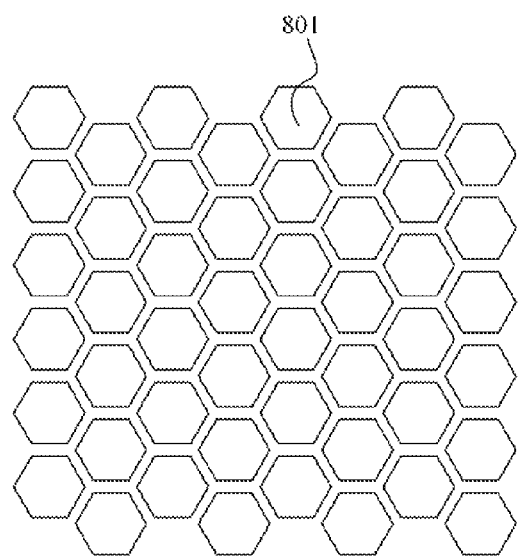
FIG. 8 is a top view showing the spatial filter 303 of the fingerprint detection apparatus that may be disposed under the cover layer 203 according to a preferred embodiment of the invention.

FIG. 6 is a top view showing the spatial filter 303 of the fingerprint detection apparatus that may be disposed under the cover layer 203 according to a preferred embodiment of the invention. Referring to FIG. 6, symbol 601 represents the light tunnel. In this embodiment, the light tunnel 601 of the spatial filter 303 is square, and all the light tunnels 601 of the spatial filter 303 are arranged into a rectangular array. FIG. 7 is a top view showing the spatial filter 303 of the fingerprint detection apparatus that may be disposed under the cover layer 203 according to a preferred embodiment of the invention. Referring to FIG. 7, the light tunnel 701 of the spatial filter 303 of this embodiment is circular, and all the light tunnels 701 of the spatial filter 303 are arranged into a rectangular array. FIG. 8 is a top view showing the spatial filter 303 of the fingerprint detection apparatus that may be disposed under the cover layer 203 according to a preferred embodiment of the invention. Referring to FIG. 8, the light tunnel 801 of the spatial filter 303 of this embodiment is hexagonal, and all the light tunnels 801 of the spatial filter 303 are arranged into a honeycomb shape.

The above-mentioned embodiment discloses a mobile device and a fingerprint detection apparatus that may be disposed under the cover layer 203. In the following embodiment, the method of manufacturing the fingerprint detection apparatus is disclosed.

Figure 9:
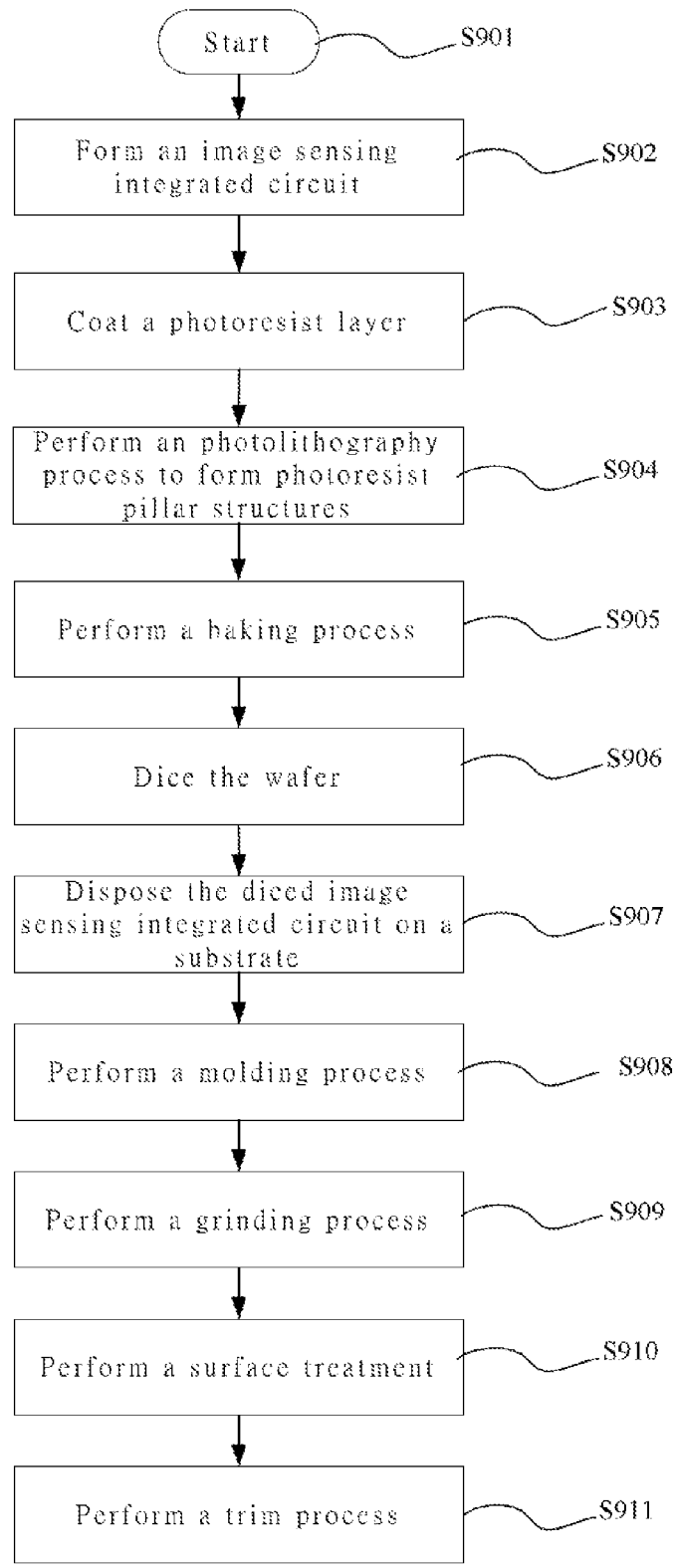
FIG. 9 is a flow chart showing a manufacturing method of the fingerprint detection apparatus according to a preferred embodiment of the invention.

FIG. 9 is a flow chart showing a manufacturing method of the fingerprint detection apparatus according to a preferred embodiment of the invention. Referring to FIG. 9, the method of manufacturing the fingerprint detection apparatus comprises the following steps.

In step S901, the method starts.

Figure 9A:
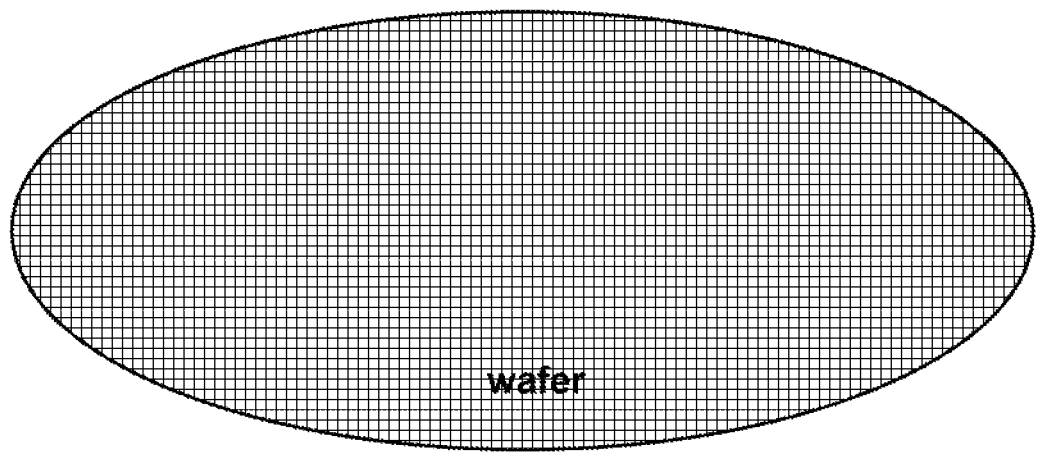
FIG. 9A is a schematic view showing an image sensing integrated circuit on a wafer according to a preferred embodiment of the invention.

In step S902, multiple image sensing integrated circuits are fabricated on a wafer. Please refer to FIG. 9A, which is a schematic view showing an image sensing integrated circuit on a wafer according to a preferred embodiment of the invention.

Figure 9B:
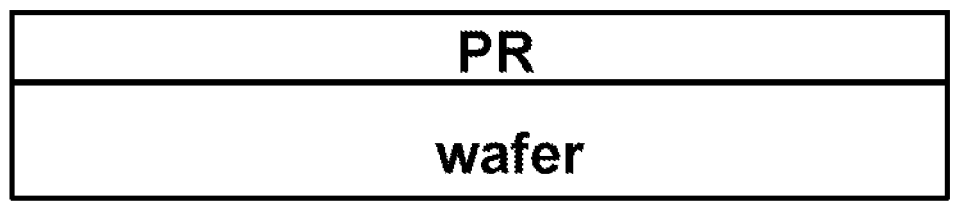
FIG. 9B is a schematic view showing a coated photoresist layer according to a preferred embodiment of the invention.

In step S903, a photoresist layer is coated on the image sensing integrated circuits. Please refer to FIG. 9B, which is a schematic view showing a coated photoresist layer according to a preferred embodiment of the invention.

Figure 9C:
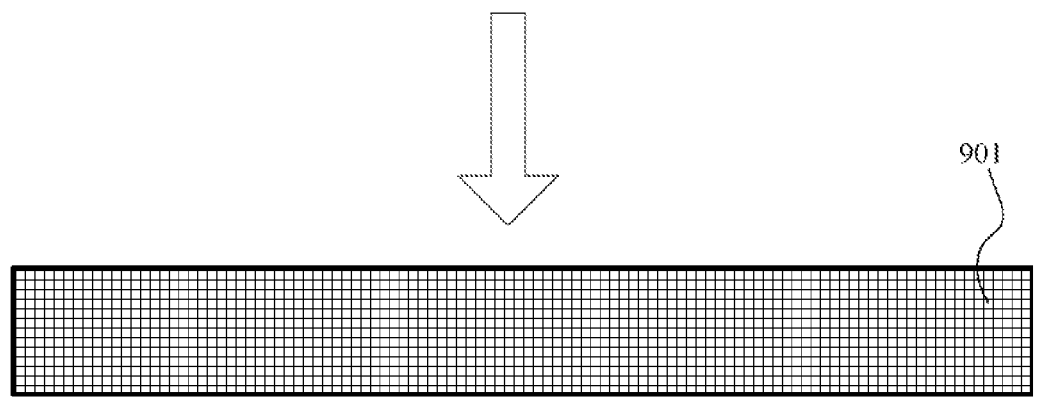
FIG. 9C is a schematic view showing an photolithography process according to a preferred embodiment of the invention.

In step S904, an photolithography process is performed to form multiple photoresist pillar structures on the image sensing integrated circuits. FIG. 9C is a schematic view showing an photolithography process according to a preferred embodiment of the invention. Referring to FIG. 9C, a grating mask 901 is used as a mask to expose the grating mask 901 in the photolithography process so that the photoresist pillar structures are formed.

In step S905, a baking process is performed to fix the photoresist pillar structures.

In step S906, the wafer is diced to obtain diced image sensing integrated circuits. Please refer to FIG. 9D, which is a schematic view showing diced image sensing integrated circuits according to a preferred embodiment of the invention.

In step S907, at least one diced image sensing integrated circuit is disposed on a substrate. FIG. 9E is a schematic view showing that the diced image sensing integrated circuits are bonded to a substrate according to a preferred embodiment of the invention. FIG. 9F is a schematic view showing a wire bonding process according to a preferred embodiment of the invention. Referring to FIGS. 9E and 9F, a substrate 902 of this embodiment is a printed circuit board (PCB), for example. When the diced image sensing integrated circuit is disposed on a substrate, the image sensing integrated circuit has to be bonded to the substrate 902, and the wire bonding also has to be performed.

In step S908, a molding process is performed on the photoresist pillar structures of the diced image sensing integrated circuits. Please refer to FIG. 9G, which is a schematic view showing the process of molding the diced image sensing integrated circuits according to a preferred embodiment of the invention. Generally speaking, the molding process mainly utilizes the epoxy to package the diced image sensing integrated circuits.

In step S909, a grinding process is performed to expose the photoresist pillar structures. Please refer to FIG. 9H, which is a schematic view showing a grinding process performed on the molded diced image sensing integrated circuits according to a preferred embodiment of the invention. The grinding process mainly grinds the excess epoxy to expose the photoresist pillar structures.

In step S910, a surface treatment is performed so that a protective layer is added onto the fingerprint detection apparatus. Please refer to FIG. 9I, which is a schematic view showing a surface treatment process performed on the ground diced image sensing integrated circuits according to a preferred embodiment of the invention. Generally speaking, the protective layer added onto the fingerprint detection apparatus can prevent the ultra-violet ray and scratch, and can also have other functional effects. For example, when the LED 304 is an infrared LED, the protective layer can let only the infrared light pass, filter out other bands of light or provide the decorative color.

Figure 9D:
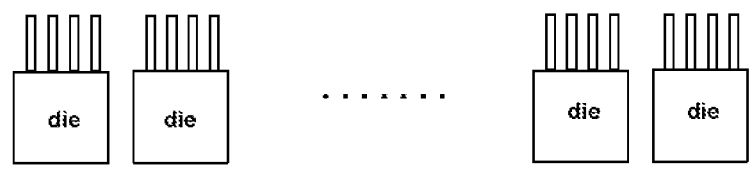
FIG. 9D is a schematic view showing diced image sensing integrated circuits according to a preferred embodiment of the invention.
Figure 9E:
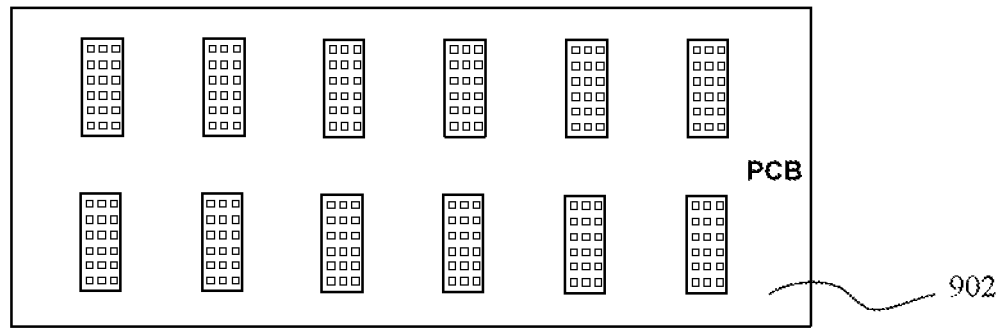
FIG. 9E is a schematic view showing that the diced image sensing integrated circuits are bonded to a substrate according to a preferred embodiment of the invention.
Figure 9F:
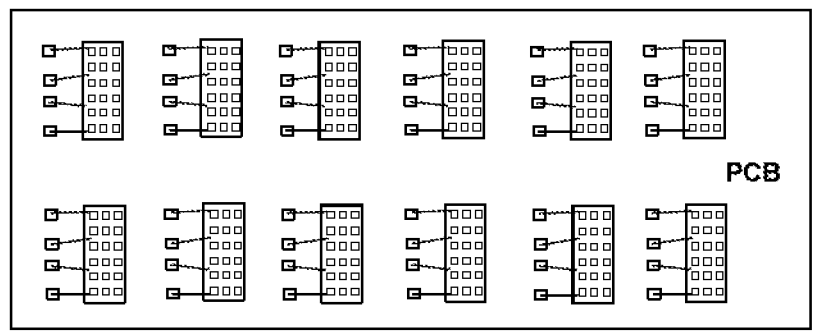
FIG. 9F is a schematic view showing a wire bonding process according to a preferred embodiment of the invention.
Figure 9G:
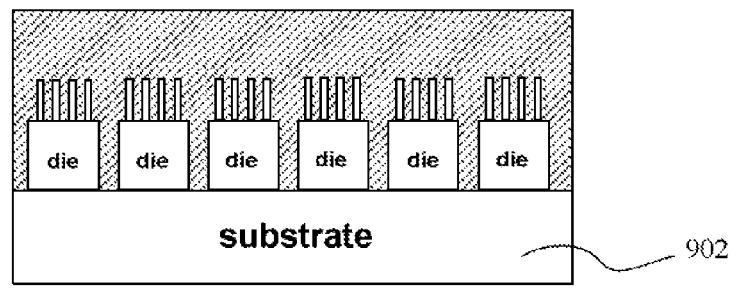
FIG. 9G is a schematic view showing the process of molding the diced image sensing integrated circuits according to a preferred embodiment of the invention.
Figure 9H:
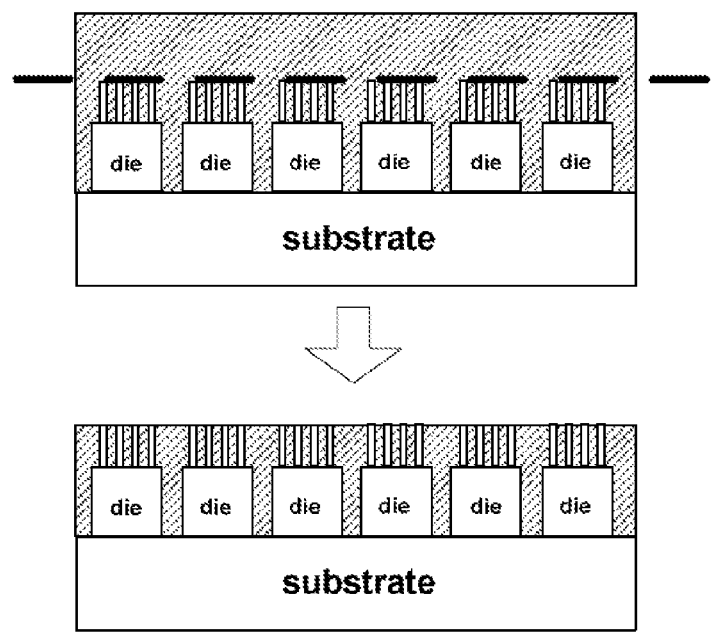
FIG. 9H is a schematic view showing a grinding process performed on the molded diced image sensing integrated circuits according to a preferred embodiment of the invention.
Figure 9I:
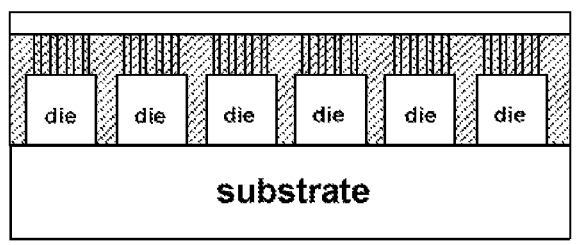
FIG. 9I is a schematic view showing a surface treatment process performed on the ground diced image sensing integrated circuits according to a preferred embodiment of the invention.
Figure 9J:
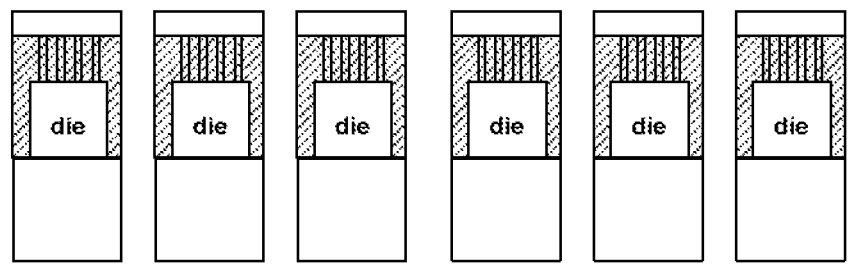
FIG. 9J is a schematic view showing a trimming process performed on the surface-treated diced image sensing integrated circuits according to a preferred embodiment of the invention.

In step S911, a trimming process is performed to trim the semi-facture of the fingerprint detection apparatus of FIG. 9I into a facture. FIG. 9J is a schematic view showing a trimming process performed on the surface-treated diced image sensing integrated circuits according to a preferred embodiment of the invention. Referring to FIG. 9J, the trimming process can be implemented using a mechanical tool or laser cutting.

In the above-mentioned embodiment, the protective layer of the step S910 pertains to an optional design. Those skilled in the art may also choose to omit the protective layer, so the step S910 pertains to a non-essential step, and the invention is not restricted thereto.

Figure 9K:
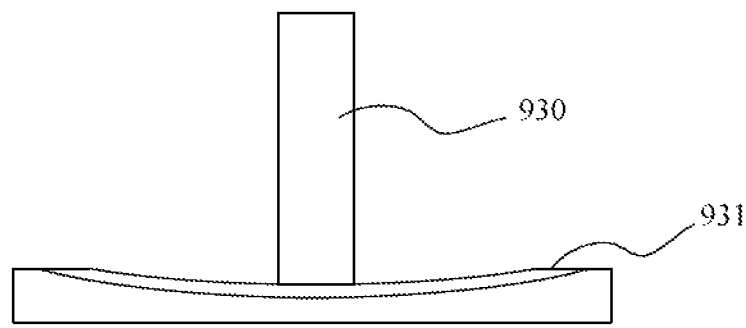
FIG. 9K is a schematic view showing a photoresist pillar structure disposed on a sensing block of the image sensing integrated circuit according to a preferred embodiment of the invention.

In the practical condition, the contact between the photoresist pillar structure of FIGS. 9C and 9D and the image sensing integrated circuit is the heterogeneous configuration. FIG. 9K is a schematic view showing a photoresist pillar structure disposed on a sensing block of the image sensing integrated circuit according to a preferred embodiment of the invention. Referring to FIG. 9K, this condition tends to affect the production yield because the contact surface area between the photoresist pillar structure 930 and the image sensor cell 931 of the image sensing integrated circuit changes with the variation of the manufacturing process.

Figure 9L:
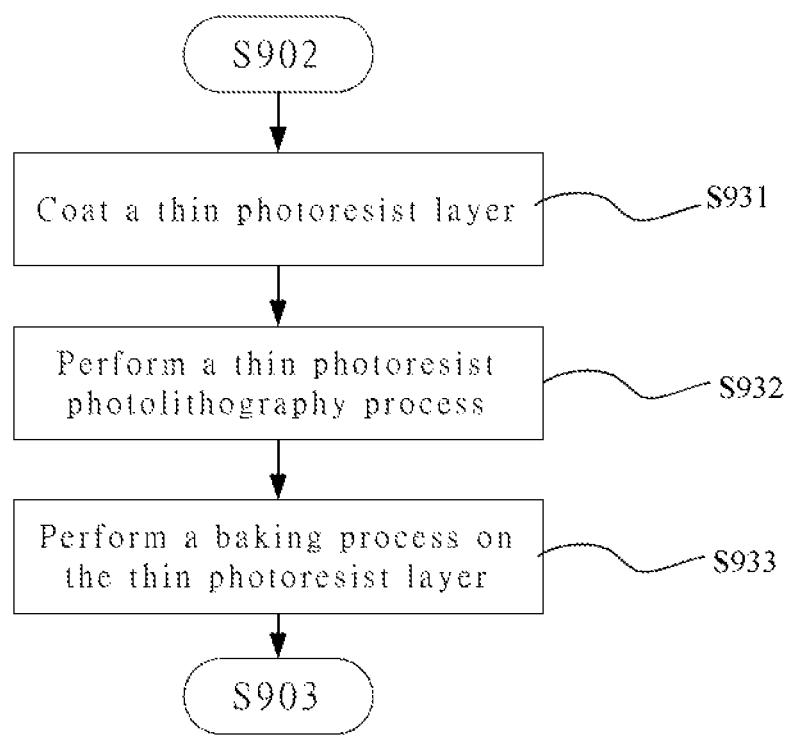
FIG. 9L is a flow chart showing a manufacturing method of the fingerprint detection apparatus according to a preferred embodiment of the invention.

In this embodiment, in order to improve the production yield, a preliminary photolithography process is firstly performed before the step S903. FIG. 9L is a flow chart showing a manufacturing method of the fingerprint detection apparatus according to a preferred embodiment of the invention. Referring to FIG. 9L, the method further comprises, before the step S902, the following steps.

In step S931, a thin photoresist layer is coated.

In step S932, a thin photoresist photolithography process is performed to form multiple large-area thin photoresist substrates 932 on the image sensor cells 931 of the image sensing integrated circuit.

Figure 9M:
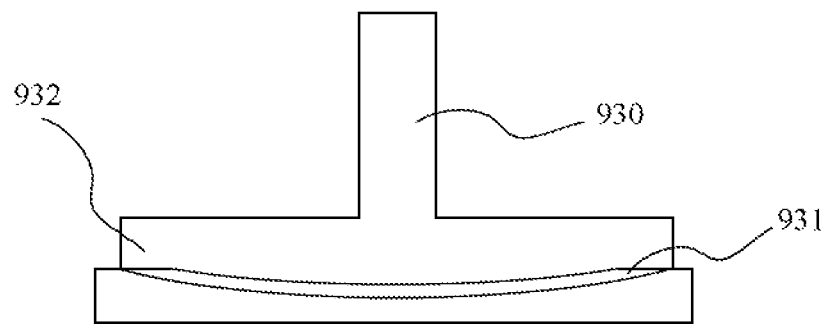
FIG. 9M is a schematic view showing an enhanced photoresist pillar structure disposed on the sensing block of the image sensing integrated circuit according to a preferred embodiment of the invention.

In step S933, a baking process is performed on the thin photoresist substrate. After the baking process is finished, the photoresist coating of the step S903 and the photolithography of the step S904 are performed. Because the baked thin photoresist layer already has the chemical change, the baked thin photoresist layer cannot be etched in the photolithography process of the step S904. FIG. 9M is a schematic view showing an enhanced photoresist pillar structure disposed on the sensing block of the image sensing integrated circuit according to a preferred embodiment of the invention. Referring to FIG. 9M, the attachment area between the photoresist pillar structure and the image sensor cell of the image sensing integrated circuit is enhanced according to the steps S931 and S932, so that the production yield is improved.

Figure 10:
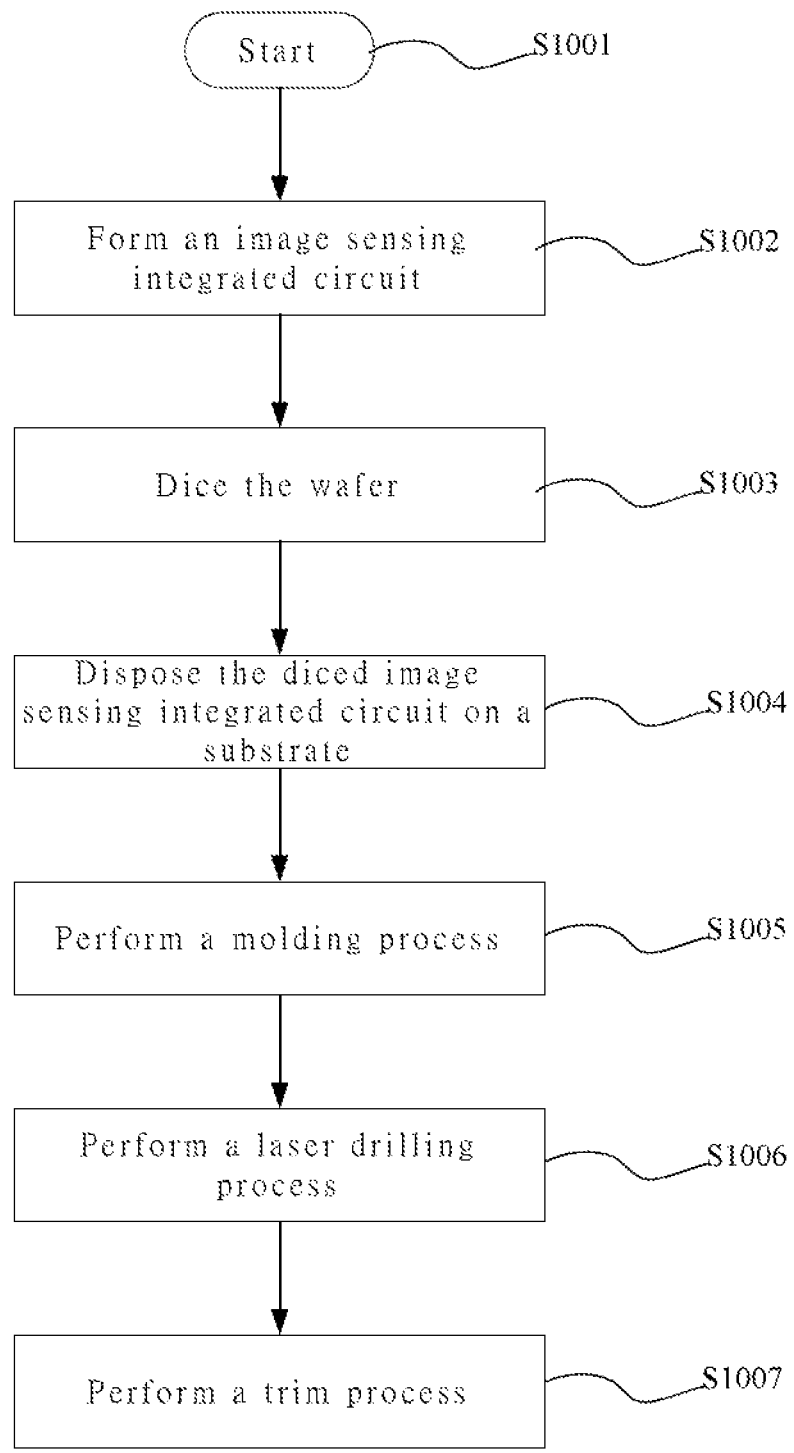
FIG. 10 is a flow chart showing a manufacturing method of the fingerprint detection apparatus according to a preferred embodiment of the invention.

FIG. 10 is a flow chart showing a manufacturing method of the fingerprint detection apparatus according to a preferred embodiment of the invention. Referring to FIG. 10, the method of manufacturing the fingerprint detection apparatus comprises the following steps.

In step S1001, the method starts.

In step S1002, multiple image sensing integrated circuits are formed on a wafer.

Figure 10A:
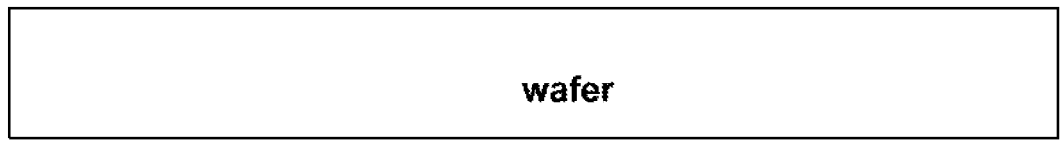
FIG. 10A is a schematic view showing diced image sensing integrated circuits according to a preferred embodiment of the invention.
Figure 10A:
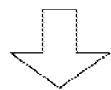
Figure 10A:

In step S1003, the wafer is diced to obtain multiple diced image sensing integrated circuits. Please refer to FIG. 10A, which is a schematic view showing diced image sensing integrated circuits according to a preferred embodiment of the invention.

Figure 10B:
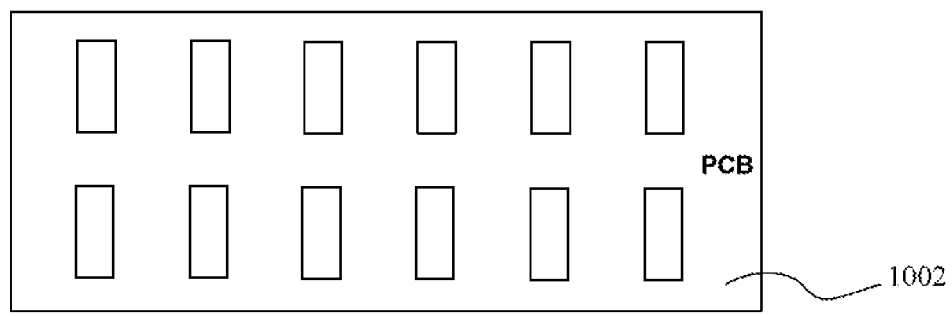
FIG. 10B is a schematic view showing that the diced image sensing integrated circuits are bonded to a substrate according to a preferred embodiment of the invention.
Figure 10C:
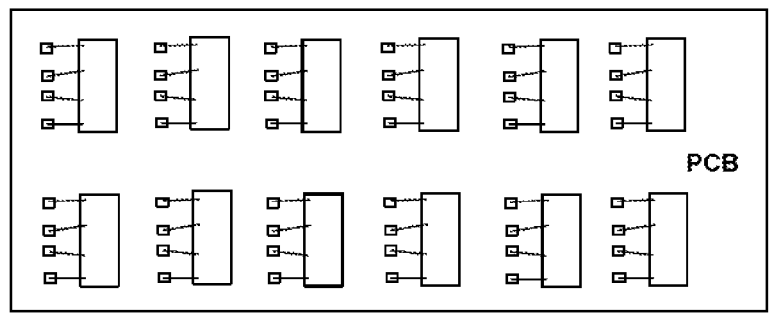
FIG. 10C is a schematic view showing a wire bonding process according to a preferred embodiment of the invention.

In step S1004, at least one diced image sensing integrated circuit is disposed on a substrate. FIG. 10B is a schematic view showing that the diced image sensing integrated circuits are bonded to a substrate according to a preferred embodiment of the invention. FIG. 10C is a schematic view showing a wire bonding process according to a preferred embodiment of the invention. Referring to FIGS. 10B and 10O, a substrate 1002 of this embodiment is a printed circuit board (PCB), for example. When the diced image sensing integrated circuit is disposed on a substrate, the image sensing integrated circuit has to be bonded to the substrate 1002, and wire bonding also needs to be performed.

Figure 10D:
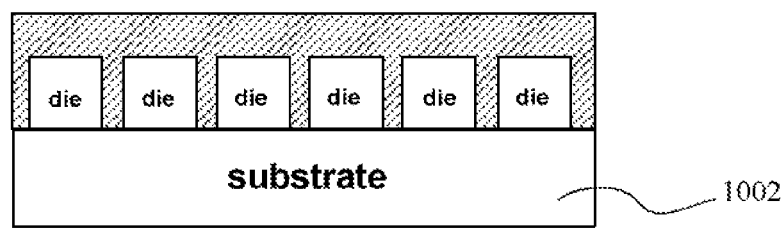
FIG. 10D is a schematic view showing a process of molding the diced image sensing integrated circuit according to a preferred embodiment of the invention.

In step S1005, a molding process is performed to package the diced image sensing integrated circuit into a specific package material. Please refer to FIG. 10D, which is a schematic view showing a process of molding the diced image sensing integrated circuit according to a preferred embodiment of the invention. Generally speaking, the molding process mainly utilizes the epoxy to package the diced image sensing integrated circuits.

In step S1006, a laser drilling process is performed. Please refer to FIG. 10E, which is a schematic view showing a laser drilling process performed on the molded image sensing integrated circuits according to a preferred embodiment of the invention. The laser drilling process constitutes a spatial filter on the molded image sensing integrated circuits. The spatial filter has adjacent light tunnels, which restrict an incident angle of light to the image sensing integrated circuit to prevent the scattered light from entering the image sensing circuit.

Figure 10E:
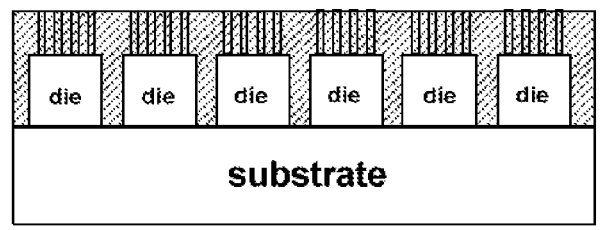
FIG. 10E is a schematic view showing a laser drilling process performed on the molded image sensing integrated circuits according to a preferred embodiment of the invention.
Figure 10F:
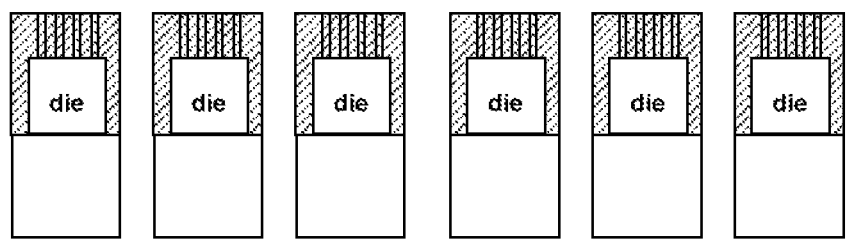
FIG. 10F is a schematic view showing a trimming process performed on the laser-drilled diced image sensing integrated circuits according to a preferred embodiment of the invention.

In step S1007, a trimming process is performed to trim the semi-facture trim of the fingerprint detection apparatus of FIG. 10E into a facture. The trimming process may be implemented using a mechanical tool or laser cutting. Please refer to FIG. 10F, which is a schematic view showing a trimming process performed on the laser-drilled diced image sensing integrated circuits according to a preferred embodiment of the invention.

In this embodiment, the light tunnel is formed using the laser to drill the epoxy. The step S910 of FIG. 9 can be similarly added to the above-mentioned embodiment, so that the manufactured fingerprint detection apparatus has the added protective layer. Herein, the details will be omitted.

Figure 11:
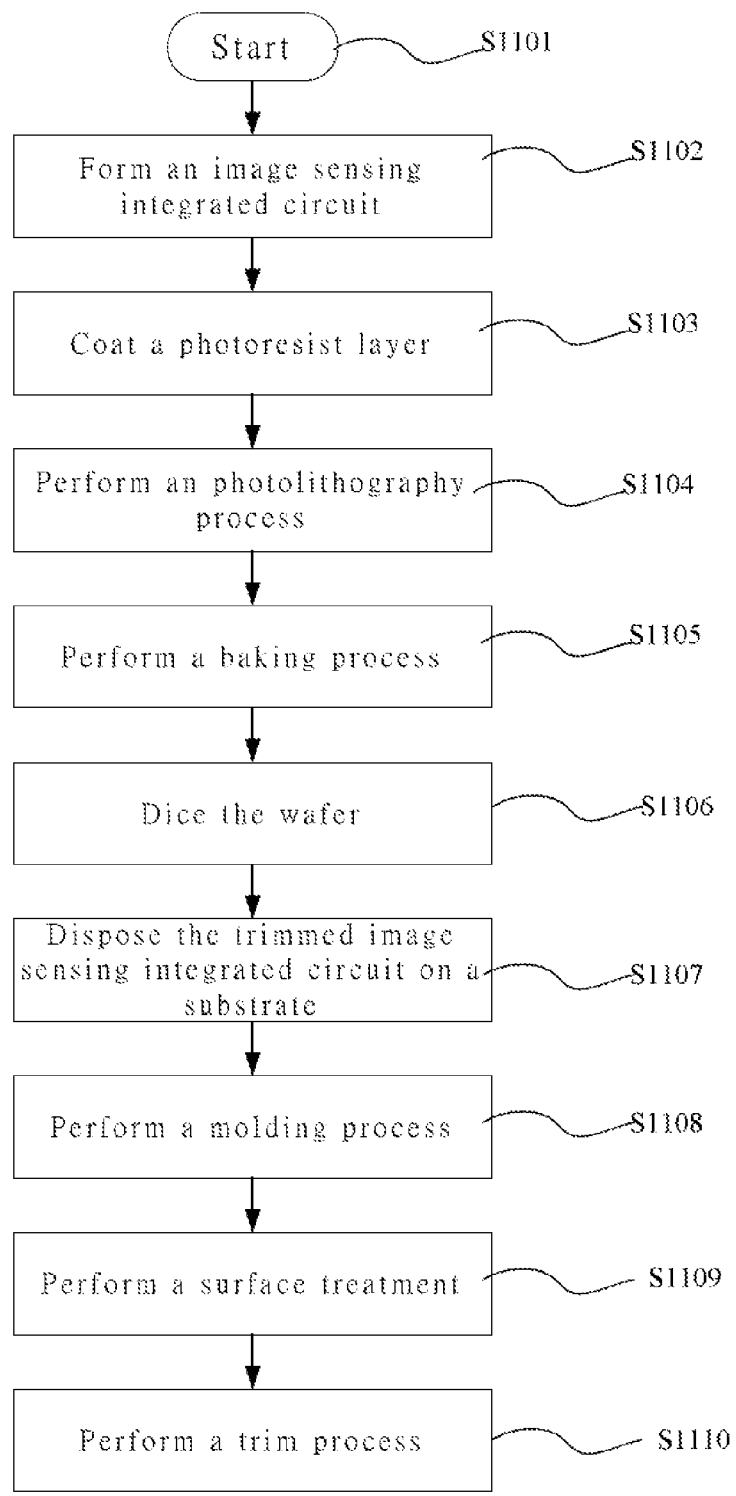
FIG. 11 is a flow chart showing a manufacturing method of the fingerprint detection apparatus according to a preferred embodiment of the invention.

FIG. 11 is a flow chart showing a manufacturing method of the fingerprint detection apparatus according to a preferred embodiment of the invention. Referring to FIG. 11, the method of manufacturing the fingerprint detection apparatus comprises the following steps.

In step S1101, the method starts.

In step S1102, multiple image sensing integrated circuits are formed on a wafer.

In step S1103, a photoresist layer is coated on the image sensing integrated circuits.

Figure 11A:
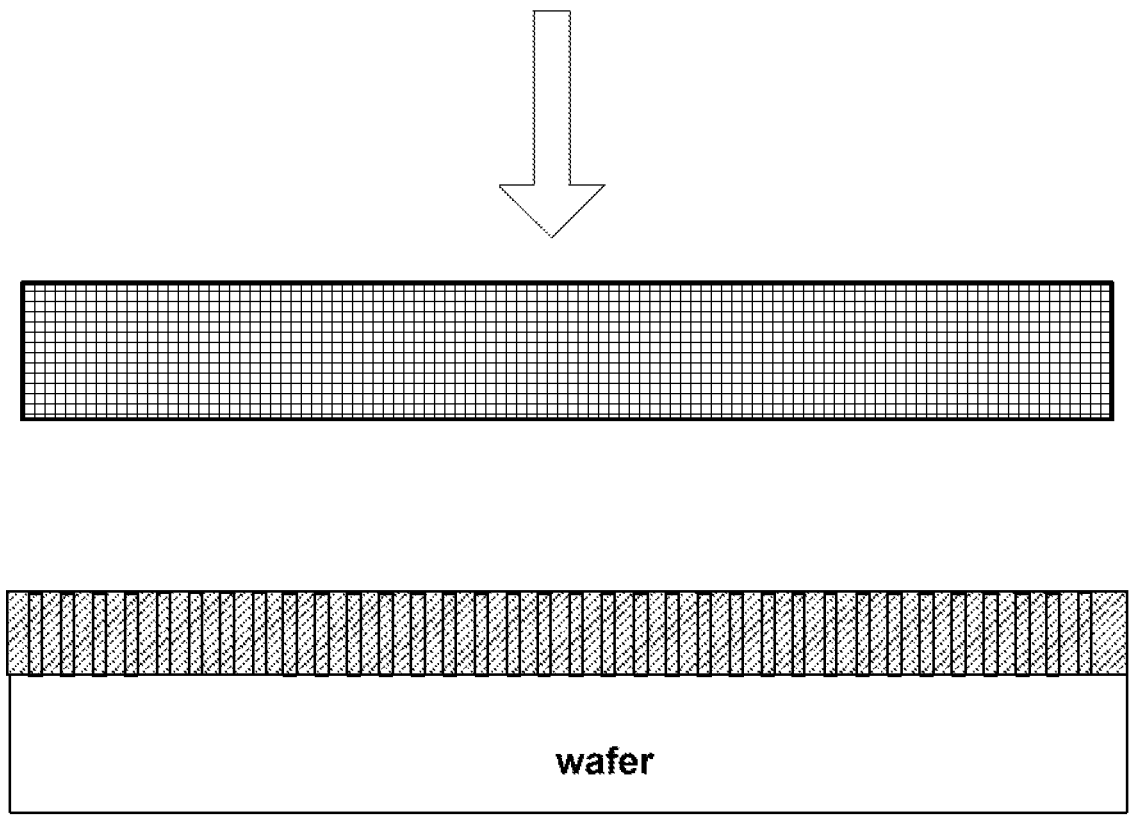
FIG. 11A is a schematic view showing an photolithography process according to a preferred embodiment of the invention.

In step S1104, an photolithography process is performed to form adjacent light tunnels on the image sensing integrated circuits. FIG. 11A is a schematic view showing an photolithography process according to a preferred embodiment of the invention. Referring to FIG. 11A, multiple grid-structure light tunnels are formed on the image sensing integrated circuits. The light tunnels restrict an incident angle of light to the image sensing integrated circuit to prevent scattered light from entering the image sensing integrated circuit.

In step S1105, a baking process is performed on the grid-structure light tunnels.

Figure 11B:
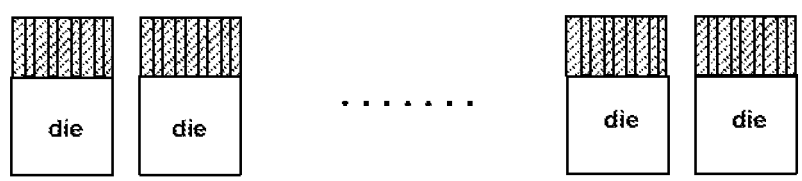
FIG. 11B is a schematic view showing diced image sensing integrated circuits according to a preferred embodiment of the invention.

In step S1106, the wafer is diced to obtain multiple diced image sensing integrated circuits. Please refer to FIG. 11B, which is a schematic view showing diced image sensing integrated circuits according to a preferred embodiment of the invention.

Figure 11C:
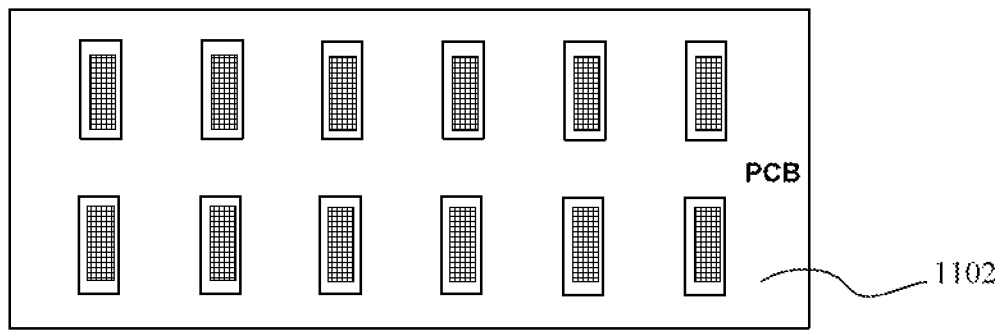
FIG. 11C is a schematic view showing that the diced image sensing integrated circuits are bonded to a substrate according to a preferred embodiment of the invention.
Figure 11D:
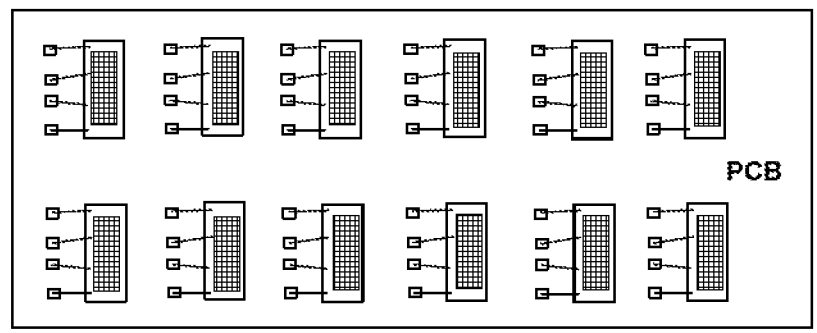
FIG. 11D is a schematic view showing a wire bonding process according to a preferred embodiment of the invention.

In step S1107, at least one diced image sensing integrated circuit is disposed on a substrate. Please refer to FIGS. 11C and 11D. FIG. 11C is a schematic view showing that the diced image sensing integrated circuits are bonded to a substrate according to a preferred embodiment of the invention. FIG. 11D is a schematic view showing a wire bonding process according to a preferred embodiment of the invention. In this embodiment, the substrate 1102 is a printed circuit board (PCB), for example. When the diced image sensing integrated circuit is disposed on a substrate, the image sensing integrated circuit has to be bonded to the substrate 1102, and wire bonding also needs to be performed.

Figure 11E:
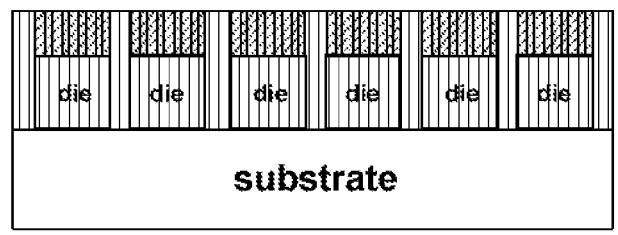
FIG. 11E is a schematic view showing a process of molding the diced image sensing integrated circuits according to a preferred embodiment of the invention.

In step S1108, a molding process is performed on the photoresist pillar structure of the diced image sensing integrated circuit. Please refer to FIG. 11E, which is a schematic view showing a process of molding the diced image sensing integrated circuits according to a preferred embodiment of the invention. Generally speaking, the molding process packages the diced image sensing integrated circuit mainly utilizing the epoxy.

In step S1109, a surface treatment is performed to add a protective layer onto the fingerprint detection apparatus. Please refer to FIG. 11F, which is a schematic view showing a surface treatment process according to a preferred embodiment of the invention. Generally speaking, in addition to a protective layer added onto the fingerprint detection apparatus to prevent the ultra-violet ray and scratch, the protective layer may also have other functional effects. For example, when the LED 304 is an infrared LED, the protective layer can let only the infrared light pass, and filter other bands of light or provide the decorative color.

Figure 11F:
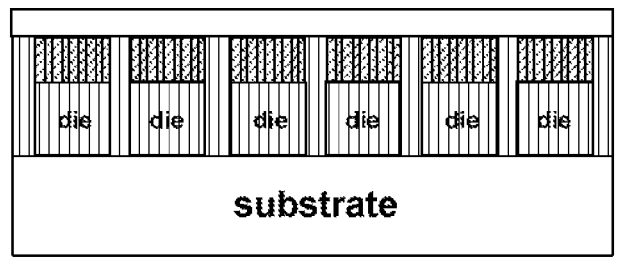
FIG. 11F is a schematic view showing a surface treatment process according to a preferred embodiment of the invention.
Figure 11G:
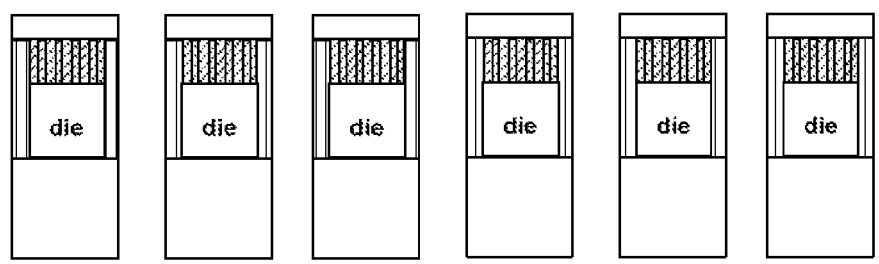
FIG. 11G is a schematic view showing a process of trimming the surface-treated diced image sensing integrated circuits according to a preferred embodiment of the invention.

In step S1110, a trimming process is performed to trim the semi-facture of the fingerprint detection apparatus of FIG. 11F into a facture, as shown in FIG. 11G, which is a schematic view showing a process of trimming the surface-treated diced image sensing integrated circuits according to a preferred embodiment of the invention. The trimming process may also be implemented by a mechanical tool or by way of laser cutting.

Similarly, in the above-mentioned embodiment, the protective layer of the step S1109 pertains to an optional design. Those skilled in the art may also choose to omit the protective layer, so the step S1109 pertains to a non-essential step, and the invention is not restricted thereto.

In summary, the essence of the invention is to form a spatial filter, which restricts the scattered light from entering the image sensing integrated circuit and is disposed above the image sensing integrated circuit, by various processing methods. Thus, even if the fingerprint detection apparatus is disposed on the too-thick protective glass, the fingerprint detection apparatus is disposed under a protective glass by a distance, or an air gap is present between the fingerprint detection apparatus and the protective glass, the image sensing integrated circuit still can normally perform the operation of capturing the pattern of the fingerprint without being affected by the scattered light.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A fingerprint detection apparatus, comprising:
   an image sensing integrated circuit; and
   a spatial filter disposed on the image sensing integrated circuit, wherein the spatial filter has adjacent light tunnels, and the light tunnel restricts an incident angle of light to the image sensing integrated circuit to prevent scattered light from entering the image sensing integrated circuit,
   wherein, when a finger is disposed on a upper side of the spatial filter, a corresponding cell of the image sensor detects a ridge portion of the finger as a bright portion, and detects a valley portion of the finger as a dark portion, and
   wherein photoresist pillars are resrespectively disposed in the light tunnels.

2. The fingerprint detection apparatus according to claim 1, wherein the light tunnels of the spatial filter constitute a two-dimensional array.

3. The fingerprint detection apparatus according to claim 1, further comprising:
   a specific light emitting circuit, which is disposed on one side of the image sensing integrated circuit, and is electrically connected to the image sensing integrated circuit,
   wherein a bottom of the specific light emitting circuit and a bottom of the image sensing integrated circuit is on a same plane of a substrate.

4. The fingerprint detection apparatus according to claim 1, further comprising:
   a visible light emitting circuit, which is disposed on one side of the image sensing integrated circuit, and is electrically connected to the image sensing integrated circuit,
   wherein when a fingerprint identification is performed, the visible light emitting circuit emits a visible light to make a user obtain a finger placement position according to the visible light.

5. The fingerprint detection apparatus according to claim 1, wherein the fingerprint detection apparatus may be disposed under a protective glass, and the spatial filter filters out the scattered light to prevent a fingerprint shape from being incorrectly judged.

6. A mobile device, comprising:
   a control circuit;
   a display panel electrically connected to the control circuit;
   a cover layer disposed on the display panel; and
   a fingerprint detection apparatus, comprising:
   an image sensing integrated circuit electrically connected to the control circuit; and
   a spatial filter disposed on the image sensing integrated circuit, wherein the spatial filter has adjacent light tunnels, and the light tunnel restricts an incident angle of light to the image sensing integrated circuit to prevent scattered light from entering the image sensing integrated circuit, wherein, when a finger is disposed on a upper side of the spatial filter, a corresponding cell of the image sensor detects a ridge portion of the finger as a bright portion, and detects a valley portion of the finger as a dark portion, wherein photoresist pillars are respectively disposed in the light tunnels.

7. The mobile device according to claim 6, wherein the light tunnels of the spatial filter constitute a two-dimensional array.

8. The mobile device according to claim 6, further comprising:

a specific light emitting circuit, which is disposed on one side of the image sensing integrated circuit, and is electrically connected to the image sensing integrated circuit, wherein a bottom of the specific light emitting circuit and a bottom of the image sensing integrated circuit is on a same plane of a substrate.

9. The mobile device according to claim 6, further comprising:

a visible light emitting circuit, which is disposed on one side of the image sensing integrated circuit, and is electrically connected to the image sensing integrated circuit, wherein when a fingerprint identification is performed, the control circuit controls the image sensing integrated circuit, so that the visible light emitting circuit emits a visible light to make a user obtain a finger placement position according to the visible light.

10. The mobile device according to claim 6, wherein the fingerprint detection apparatus may be disposed under a protective glass, and the spatial filter filters out the scattered light to prevent a fingerprint shape from being incorrectly judged.

11. A method of manufacturing a fingerprint detection apparatus, the method comprising the steps of:

forming multiple image sensing integrated circuits on a wafer;

coating a photoresist layer on the image sensing integrated circuits;

performing an photolithography process to form adjacent light tunnels on the image sensing integrated circuits, wherein the light tunnel restricts an incident angle of light to the image sensing integrated circuit to prevent scattered light from entering the image sensing integrated circuit;

performing a baking process;

dicing the wafer to obtain multiple diced image sensing integrated circuits;

disposing at least one of the diced image sensing integrated circuits on a substrate;

performing a molding process on a photoresist pillar structure of the diced image sensing integrated circuit; and performing a trimming process to form the independent fingerprint detection apparatuses.

\* \* \* \* \*